United States Patent [19]

Battey et al.

[11] Patent Number: 4,695,348

[45] Date of Patent: Sep. 22, 1987

[54] COPPER ETCHING PROCESS AND PRODUCT

[75] Inventors: James F. Battey, Los Altos; Norvell J. Nelson, Palo Alto; Daniel J. Barnett, San Jose, all of Calif.

[73] Assignee: PSI Star, Fremont, Calif.

[21] Appl. No.: 907,078

[22] Filed: Sep. 15, 1986

[51] Int. Cl.$^4$ ............................ C23F 1/02; B44C 1/22
[52] U.S. Cl. ..................................... 156/647; 29/846; 156/150; 156/630; 156/634; 156/659.1; 156/666; 156/901; 156/902; 156/656; 174/68.5; 252/79.2; 252/79.4; 428/209; 428/457; 428/601
[58] Field of Search .................... 174/68.5; 252/79.2, 252/79.4; 156/150, 151, 647, 656, 630, 634, 659.1, 666, 901, 902; 29/846; 428/601, 209, 457

[56] References Cited

U.S. PATENT DOCUMENTS 4,543,153  9/1985  Nelson ................................ 156/646

Primary Examiner—William A. Powell
Attorney, Agent, or Firm—Flehr, Hohbach, Test, Albritton & Herbert

[57] ABSTRACT

Copper etching process and product particularly suitable for use in the manufacture of printed circuit boards. The copper is etched in a liquid etchant, and the crystal structure of the copper is selected and carefully controlled to provide an anisotropic etch and a relatively high vertical-to-lateral etching ratio. In one disclosed embodiment, the etching solution contains nitric acid, copper nitrate or sulfuric acid, a polymer and a surfactant, and the copper has a top surface crystal structure with predominantly (111) and (200) orientations and relatively little (220) orientation. In another disclosed embodiment, the etching solution contains hydrogen peroxide and sulfuric acid, and the copper foil has a top surface crystal structure with predominantly (311) and (511) orientations. A printed circuit board manufactured in accordance with the invention has a copper foil with a crystal structure selected to provide anisotropic etching and a relatively high vertical-to-lateral etching ratio with a given etching solution bonded to a substrate, with portions of the copper foil being etched away by the etching solution to form the desired foil pattern.

33 Claims, No Drawings

COPPER ETCHING PROCESS AND PRODUCT

This invention pertains generally to the etching of copper, and more particularly to a copper etching process and product particularly suitable for use in the manufacture of printed circuit boards.

Copper foil used in the manufacture of electronic circuit boards is electrodeposited on metal surfaces from solution. Thicker foils (½, 1 and 2 ounce per square foot) are deposited on chromium plated drums and peeled off. The thinner foils (⅛ and ¼ ounce per square foot) are deposited on an aluminum carrier foil backing which is not removed until just prior to use. The copper foil is protected by the carrier foil during lamination to a substrate fabricated of an electrically insulative material such as fiberglass and epoxy.

At the present time, most etching of copper on two-sided or multilayer circuit boards is done with either alkaline-ammonia based etchants or hydrogen peroxide-sulfuric acid etchants. Each of these processes has certain limitations and disadvantages. For general use, the alkaline-ammonia process is relatively fast, reasonably tolerant of metal resists and some dry film resists, and has a substantial copper carrying capacity. However, it does not work well with fine line geometries, the dissolved copper is difficult to recover, and fumes from the ammonia present a problem. The hydrogen peroxide-sulfuric acid process is much cleaner, and the dissolved copper is readily recovered as a marketable product. However, the process is relatively slow, and it requires substantial cooling for stability control, due to the auto-decomposition reaction of hydrogen peroxide. In addition, both the performance of the process and the decomposition of the peroxide are very sensitive to trace impurities.

In each of these processes, there is a tendency for the copper to be removed more quickly in areas where fine lines are present than in larger open areas. This results in undercutting of the lines while the larger areas are being cleared of copper. Neither process is truly anisotropic.

U.S. Pat. No. 4,497,687 describes an improved process for anisotropically etching copper foil in the manufacture of printed circuit boards. This process utilizes an aqueous solution of nitric acid as an etchant, and it overcomes many of the problems of the other processes discussed above. U.S. Pat. No. 4,545,850 discloses a somewhat similar process in which the etching solution is regenerated by adding sulfuric acid. Even with these improved processes, some instances have been encountered in which there has been inexplicable lateral etching or undercutting of the copper.

It is in general an object of the invention to provide a new and improved copper etching process and product in which lateral etching and undercutting are eliminated.

Another object of the invention is to provide an etching process and product of the above character in which anisotropic etching is achieved consistently.

These and other objects are achieved in accordance with the invention by etching the copper in an aqueous solution and carefully controlling the crystal structure of the copper to provide anisotropic etching and a relatively high vertical-to-lateral etching ratio. In one disclosed embodiment, the etching solution contains nitric acid, copper nitrate or sulfuric acid, a polymer and a surfactant, and the copper has a top surface crystal structure whose Miller indices are predominantly (111) and (200) orientations and relatively little (220) orientation. In another disclosed embodiment, the etching solution contains hydrogen peroxide and sulfuric acid, and the copper foil has a top surface crystal structure with predominantly (311) and (511) orientations. A printed circuit board manufactured in accordance with the invention has a copper foil with a crystal structure selected to provide anisotropic etching and a relatively high vertical-to-lateral etching ratio with a given etching solution, with portions of the copper foil being etched away by the etching solution to form the desired foil pattern.

The electrodeposited foil used in circuit boards grows in columnar crystals with axes perpendicular to the surface of the foil. The dimensions of the crystals are typically on the order of 1 mil. It has been found that when the crystals have a predominantly favorable orientation, the etching of the copper foil proceeds at a faster rate perpendicular to the foil surface than parallel to the surface. This is desirable because it avoids undercutting or etching of the copper beneath the photoresist or other mask employed to define the etch pattern. In addition, the etch is anisotropic in that the side walls of the etch pattern are perpendicular to the top surface or plane of the copper foil. These advantages make it possible to etch circuit boards with fine geometry and controlled geometry of higher quality and higher yield than an etch which is isotropic and removes material in all directions at the same rate.

The nitric acid etching chemistry employed in one embodiment of the invention is disclosed in detail in U.S. Pat. Nos. 4,497,687 and 4,545,850. Nitric acid reacts with copper according to the relationship $$3Cu + 8HNO_3 = 3Cu(NO_3)_2 + 2NO + 4H_2O$$

with the nitric acid serving both as an oxidant and as an anion source for the dissolved copper. The dissolved copper is removed by adding sulfuric acid to precipitate the copper according to the relationship $$3Cu(NO_3)_2 + 3H_2SO_4 = 3CuSO_4 + 6HNO_3.$$

To protect the etch resist and the substrate board from attack by the nitric acid, either copper nitrate or sulfuric acid is included in the etching solution. When sulfuric acid is employed, the consumption of nitric acid is reduced, and the reaction proceeds according to the relationship $$3Cu + 2HNO_3 + 3H_2SO_4 = 3CuSO_4 + 2NO + 4H_2O.$$

Copper is removed as the sulfate pentahydrate according to the relationship $$CuSO_4 + 5H_2O = CuSO_4 \cdot 5H_2O.$$

The copper nitrate or sulfuric aci increases the reactivity of nitric acid toward copper such that reasonable reaction rates can be achieved with much lower concentrations of nitric acid than would otherwise be required. Thus, the amount of nitric acid can be kept to levels which do not react with the substrates or organic resists. Certain metal resists can also be utilized with these etchants, including tin, nickel and alloys thereof. If a small amount of phosphoric acid is added to the solution, tin-lead alloys can be utilized as etch resists.

A polymer is included in the etching solution to control the surface reaction rate and to enhance the anisotropy of the etch. One suitable polymer is a polyacrylamide which is soluble in water and has a high molecular weight. The amount of polymer employed is on the order of 0.05% (volume) of the solution. Suitable polyacrylamides include Dow Separan CP-7HS (a high molecular weight cationic polymer), Hercules Reten 520 (a high molecular weight neutral polyacrylamide), and Dow Separan NP-10 (a high molecular weight slightly anionic polyacrylamide).

A surfactant is also included in the etching solution to reduce surface tension and facilitate the movement of nitric oxide bubbles from the surface of the copper. The nitric oxide gas is generated during the etching process, and the surfactants serve to keep the bubble size small and prevent the bubbles from bridging between resist lines and blocking etching between the lines. Only a very small amount of surfactant is required, e.g. 0.1 to 0.2% (volume) of the etching solution. Suitable surfactants include fluorocarbon surfactants such as 3M's FC-100 (an amphoteric surfactant) and FC-135 (a cationic surfactant).

A small amount of phosphoric acid is added to the etching solution for etching boards on which solder is employed as an etch resist. The amount of phosphoric acid required is on the order of 2-3% (volume) of the etching solution. The phosphoric acid is also beneficial in etching boards in which anodized tin is employed as an etch resist. The resistive layer on the anodized tin is believed to be an oxide-phosphate which is stabilized by the phosphoric acid.

It has now been found that the anisotropy of the etch obtained with the nitric acid etchants is to some extent dependent upon the crystal structure of the copper foil. A crystal has a basic unit structure which is iterated time after time to fill once and only once the three dimensional space occupied by the crystal. In a cubic crystal such as copper, the crystal axes are perpendicular to one another as are the x, y, z axes of a Cartesian coordinate system. Further the unit distance along all three axes is the same.

Planes in a crystal are specified in terms of their Miller indices. The Miller indices are the reciprocal of the number of unit distances which the plane in question intercepts the x, y, z axes. Thus, the (111) plane intercepts all three axes at unit distance The (200) plane intercepts the x axis at ½ a unit distance is parallel to the y and z axes. Similarly the (220) plane intercepts the x and y axes at ½ a unit distance and is parallel to the z axes.

Identification of crystal planes parallel to the surface of copper foil used in our work has been done by Bragg analysis. In Bragg analysis, x-rays are impinged on the foil surface at various angles. When the reflected x-rays from the top plane of atoms have a path length which is an integral number of wavelengths shorter than the path length for the x-rays reflected from the second plane of atoms, the x-rays constructively interfere, and a maximum in intensity of reflected x-rays occur for this angle of incidence. From a knowledge of this angle and the wavelength of the x-rays, the distance between the planes of atoms can be determined. From this distance, the Miller indices of the plane of atoms parallel to the surface can be inferred. From symmetry considerations, x-ray reflections in a face-centered cubic crystal constructively interfere only from planes that have either all even or all odd Miller indices.

X-ray analysis of several boards with good anisotropy has shown that these boards had the following crystal structures (percentages of orientations):

| Sample | (111) | (200) | (220) | (311) | (331) | (420) |
|--------|-------|-------|-------|-------|-------|-------|
| A | 70.0 | 19.0 | 6.0 | 5.0 | | |
| B | 73.6 | 18.4 | 4.0 | 4.0 | | |
| C | 57 | 21 | 9 | 8 | 3 | 2 |

X-ray analysis of several boards with lateral etching and undercutting has shown that these boards had the following crystal structures (percentages of orientations):

| Sample | (111) | (200) | (220) | (311) | (331) | (420) |
|--------|-------|-------|-------|-------|-------|-------|
| D | 56.0 | 15.0 | 22.0 | 7.0 | | |
| E | 55.5 | 8.2 | 30.7 | 5.6 | | |
| F | 44 | 8 | 32 | 7 | 6 | 3 |
| G | 43 | 8 | 34 | 7 | 5 | 3 |
| H | 43 | 13 | 28 | 9 | 5 | 2 |
| I | 35 | 15 | 21 | 15 | 7 | 7 |
| J | 34 | 18 | 16 | 17 | 6 | 9 |
| K | 33 | 15 | 19 | 16 | 8 | 9 |

From this data, it appears that good etching is obtained when the crystal orientation is predominantly (111) and (200) with relatively little (220) orientation. For good results, at least 70% of the orientation should be (111) and (200), and the (220) orientation should be no more than about 15% and preferably less than about 8% of the structure.

In the following example, the etch was anisotropic in that it had straight side walls, but the vertical-to-lateral etching ratio was about 2:1 and there was substantial removal of copper beneath the photoresist:

| Sample | (111) | (200) | (220) | (311) | (331) | (420) |
|--------|-------|-------|-------|-------|-------|-------|
| L | 46 | 23 | 14 | | 12 | 2 |

Similar results have been obtained with other samples having relatively high percentages of (220) and higher Miller indices or orientations. For a relatively high vertical-to-lateral etching ratio (e.g. 10:1) the top surface crystal structure of the copper foil should have at least 85% (111) and (200) orientations, and this structure should extend through the foil to the back side. For a vertical-to-lateral etching ratio of 2:1, the top surface of the copper foil should have at least 65% (111) and (200) orientations, and this structure should extend to the back side of the foil.

In the examples given above (Samples A-L), the etching was done with an aqueous solution containing 3 liters of copper nitrate solution (density 1.45), 1 liter of 70% nitric acid, 100 ml of a 2% solution of Separan CP-7HS, and 5 ml of FC-100.

It has also been found that the anisotropy and the vertical-to-lateral etching ratio obtained with a hydrogen peroxide-sulfuric acid etching solution can be improved by including a polymer and a surfactant in the solution and by proper selection of the crystal structure of the copper. The following table shows the relative etch rates obtained with single crystal copper slugs and an etching solution containing 600 ml of 50% (volume) sulfuric acid, 210 ml of 50% (volume) hydrogen peroxide, 60 ml of sodium molybdate solution (0.5 g/ml), 55 ml of phenol sulfonic acid solution (Ferro PSA 1000) and 2.075 liters of deionized water, with the additives indicated:

| Additive(s) | (111) | (110) | (100) | (210) | (211) | (311) | (511) |
| --- | --- | --- | --- | --- | --- | --- | --- |
| Separan CP7 | 1.0 | .97 | .69 | 1.0 | 1.1 | 18.4 | |
| Separan CP7 | 1.0 | 1.1 | .63 | 1.5 | 2.2 | 16.2 | |
| Separan CP7 (1 day older) | 1.0 | | 1.8 | | | 13.0 | 12.2 |
| Reten 520 | 1.0 | 2.1 | 5.7 | 2.4 | 3.1 | 9.1 | 9.8 |
| Reten 520 and Dimethylamine | 1.0 | 2.0 | 3.4 | | | 10.9 | |

From this data, it is believed that if copper foils with predominantly (311) and (511) top surface crystal orientations were prepared, the top surface planes will etch much more rapidly than the side planes in a hydrogen peroxide-sulfuric acid solution with a variety of different additives. The etch factors, i.e. the vertical-to-lateral etching ratios, would vary from about 5:1 to about 20:1, depending upon the additives.

It has recently been found that copper having a high percentage of a desired crystal orientation can be produced by sputtering a thin film of copper with the desired orientation onto a suitable backing such as Teflon, Kapton or aluminum and then electrodepositing more copper onto the thin film to produce a foil of the desired thickness. The electrodeposited copper tends to grow with the same orientation as the sputtered film on which it is deposited. Using this technique, it has, for example, been possible to produce a copper foil having a (111) orientation of greater than 90%. Similar results should also be obtained by electrodepositing copper onto a thin film formed by evaporation deposition or electroless deposition.

It is apparent from the foregoing that a new and improved copper etching process and product have been provided. While only certain presently preferred embodiments have been described in detail, as will be apparent to those familiar with the art, certain changes and modifications can be made without departing from the scope of the invention as defined by the following claims.

We claim:

1. In a process utilizing a liquid etchant for manufacturing a circuit board, the steps of: selecting a copper foil having a top surface crystal structure which is etched anisotropically and with a vertical-to-lateral etching ratio of at least 10:1 by the liquid etchant, bonding the copper foil to a substrate, and exposing a portion of the copper foil to the liquid etchant to remove that portion of the foil from the substrate.

2. The process of claim 1 wherein the liquid etchant comprises an aqueous solution of nitric acid with a polymer, and the copper foil is selected to have a top surface crystal structure with predominantly (111) and (200) orientations and relatively little (220) orientation.

3. The process of claim 1 wherein the liquid etchant comprises an aqueous solution of hydrogen peroxide, sulfuric acid, a polymer and a surfactant, and the copper foil is selected to have a top surface crystal structure with predominantly (311) and (511) orientations.

4. The process of claim 1 wherein the copper foil is formed by depositing a thin film of copper of the desired crystal structure onto a backing and electrodepositing additional copper onto the thin film to grow a foil of the desired structure.

5. A circuit board manufactured by the steps of: selecting a copper foil having a top surface crystal structure which is etched anisotropically and with a vertical-to-lateral etching ratio of at least 10:1 by a liquid etchant, bonding the copper foil to a substrate, and exposing a portion of the copper foil to the liquid etchant to remove that portion of the foil from the substrate.

6. The circuit board of claim 5 wherein the liquid etchant comprises an aqueous solution of nitric acid, a polymer and a surfactant, and the copper foil is selected to have a top surface crystal structure with predominantly (111) and (200) orientations and relatively little (220) orientation.

7. The circuit board of claim 5 wherein the liquid etchant comprises an aqueous solution of hydrogen peroxide, sulfuric acid, a polymer and a surfactant, and the copper foil is selected to have a top surface crystal structure with predominantly (311) and (511) orientations.

8. The circuit board of claim 5 wherein the copper foil is formed by depositing a thin film of copper of the desired crystal structure onto a backing and electrodepositing additional copper onto the thin film to grow a foil of the desired structure.

9. In a process for manufacturing a circuit board, the steps of: bonding a copper foil having a top surface crystal structure with predominantly (111) and (200) orientations and relatively little (220) orientation to a substrate, and exposing a portion of the copper foil to an aqueous solution of nitric acid, a polymer and a surfactant to remove that portion of the foil from the substrate.

10. The process of claim 9 wherein the copper foil has at least 70% (111) and (200) orientations and less than 20% (220) orientation.

11. The process of claim 9 wherein the aqueous solution contains nitric acid, the polymer, copper nitrate or sulfuric acid, and the surfactant.

12. The process of claim 9 wherein the copper foil has a weight on the order of ¼–2 ounces per square foot of surface area.

13. The process of claim 9 wherein the copper foil is formed by depositing a thin film of copper of predominantly (111) orientation onto a backing, and electrodepositing additional copper onto the thin film to grow a foil of predominantly (111) orientation.

14. In a circuit board: a substrate, and a copper foil on one side of the substrate having a top surface crystal structure with predominantly- (111) and (200) orientations and relatively little (220) orientation, portions of the foil having been removed from the board by etching with an aqueous solution of nitric acid, a polymer and a surfactant.

15. The circuit board of claim 14 wherein the copper foil has at least 70% (111) and (200) orientations and less than 20% (220) orientation.

16. The circuit board of claim 14 wherein the aqueous solution contains nitric acid, the polymer, copper nitrate or sulfuric acid, and the surfactant.

17. The circuit board of claim 14 wherein the copper foil has a weight on the order of ¼–2 ounces per square foot of surface area.

18. The circuit board of claim 14 wherein the copper foil is formed by depositing a thin film of copper of predominantly (111) orientation onto a backing, and electrodepositing additional copper onto the thin film to grow a foil of predominantly (111) orientation.

19. A circuit board manufactured by the steps of bonding a copper foil having a top surface crystal structure with predominantly (111) and (200) orientations and relatively little (220) orientation to a substrate, and removing a portion of the copper foil from the substrate by etching with an aqueous solution of nitric acid, a polymer and a surfactant.

20. The circuit board of claim 19 wherein the copper foil has at least 70% (111) and (200) orientations and less than 20% (220) orientation.

21. The circuit board of claim 19 wherein the aqueous solution contains nitric acid, the polymer, copper nitrate or sulfuric acid, and surfactant.

22. The circuit board of claim 19 wherein the copper foil has a weight on the order of ¼–2 ounces per square foot of surface area.

23. The circuit board of claim 19 wherein the copper foil is formed by depositing a thin film of copper of predominantly (111) orientation onto a backing, and electrodepositing additional copper onto the thin film to grow a foil of predominantly (111) orientation.

24. A process of etching copper having a top surface crystal structure with predominantly (111) and (200) orientations and relatively little (220) orientation with an aqueous solution of nitric acid, a polymer and a surfactant.

25. The process of claim 24 wherein the copper has at least 70% (111) and (200) orientations and less than 20% (220) orientation.

26. The process of claim 24 wherein the aqueous solution contains nitric acid, the polymer, copper nitrate or sulfuric acid, and surfactant.

27. The process of claim 24 wherein the copper is formed by depositing a film of copper of predominantly (111) orientation onto a backing and electrodepositing additional copper onto the film to grow a foil of predominantly (111) orientation.

28. In a process for manufacturing a circuit board, the steps of: bonding a copper foil having a top surface crystal structure with predominantly (311) and (511) orientations to a substrate, and exposing a portion of the copper foil to a liquid etchant containing hydrogen peroxide, sulfuric acid, a polymer and a surfactant to remove that portion of the foil from the substrate.

29. The process of claim 28 wherein the copper foil is formed by depositing a thin film of copper of predominantly (311) and (511) orientations onto a backing and electrodepositing additional copper onto the thin film to grow a foil of predominantly (311) and (511) orientations.

30. In a circuit board: a substrate, and a copper foil on one side of the substrate having a top surface crystal structure with predominantly (311) and (511) orientations, portions of the copper foil having been removed from the board by etching with an aqueous solution containing hydrogen peroxide, sulfuric acid, and a polymer.

31. The circuit board of claim 30 wherein the copper foil is formed by depositing a thin film of copper of predominantly (311) and (511) orientations onto a backing and electrodepositing additional copper onto the thin film to grow a foil of predominantly (311) and (511) orientations.

32. A circuit board manufactured by the steps of: bonding a copper foil having a top surface crystal structure with predominantly (311) and (511) orientations to a substrate, and exposing a portion of the copper foil to a liquid etchant containing hydrogen peroxide, sulfuric acid, a polymer and a surfactant to remove that portion of the foil from the substrate.

33. The circuit board of claim 32 wherein the copper foil is formed by depositing a thin film of copper of predominantly (311) and (511) orientations onto a backing and electrodepositing additional copper onto the thin film to grow a foil of predominantly (311) and (511) orientations.

* * * * *